United States Patent [19]

Duerr

[11] Patent Number: 5,258,718
[45] Date of Patent: Nov. 2, 1993

[54] NUCLEAR MAGNETIC RESONANCE TOMOGRAPHY APPARATUS

[75] Inventor: Wilhelm Duerr, Erlangen, Fed. Rep. of Germany

[73] Assignee: Siemens Aktiengesellschaft, Munich, Fed. Rep. of Germany

[21] Appl. No.: 790,506

[22] Filed: Nov. 12, 1991

[30] Foreign Application Priority Data

Dec. 4, 1990 [DE] Fed. Rep. of Germany ....... 4038648

[51] Int. Cl.⁵ ............................................ G01R 33/20
[52] U.S. Cl. .................................................. 324/322
[58] Field of Search ............... 324/300, 307, 309, 318, 324/319, 322; 128/653.5

[56] References Cited

U.S. PATENT DOCUMENTS

| 4,620,155 | 10/1986 | Edelstein ............................. 324/322 |
| 4,763,076 | 8/1988 | Arakawa et al. .................... 324/322 |
| 4,764,726 | 8/1988 | Misic et al. ......................... 324/322 |
| 4,801,885 | 1/1989 | Meissner et al. .................... 324/318 |
| 4,890,602 | 12/1989 | Haragashira ........................ 324/318 |

FOREIGN PATENT DOCUMENTS

| 0276508 | 8/1988 | European Pat. Off. . |
| 0315382 | 5/1989 | European Pat. Off. . |
| 0317090 | 5/1989 | European Pat. Off. . |
| 3003302 | 12/1982 | Fed. Rep. of Germany . |
| 3728863 | 3/1989 | Fed. Rep. of Germany . |
| 4003138 | 8/1990 | Fed. Rep. of Germany . |
| 9012639 | 12/1990 | Fed. Rep. of Germany . |

OTHER PUBLICATIONS

Patents Abstract of Japan, P-314, Nov. 17, 1984, vol. 8/No. 252, Japanese Application No. 57-233506.
Siemens Brochure "Surge Arresters" 1985/1986.
"A Versatile Secondary Transmitter Unit for Nuclear Magnetic Resonance Spectroscopy." Retournard et al. Rev. Sci. Instrum., 6(1), Jan., 1990, pp. 69-76.

Primary Examiner—Michael J. Tokar
Attorney, Agent, or Firm—Hill, Steadman & Simpson

[57] ABSTRACT

In a nuclear magnetic resonance tomography apparatus, having a high-frequency excitation and measuring coil connected with a capacitor to form a resonant circuit, the capacitor being tuned to a desired operating frequency, a circuit is provided for limiting the voltage of the resonant capacitor in a transmission mode. Avoidance of impermissible peak amplitudes is thereby achieved without the necessity of over-dimensioning the components of the resonant circuit.

15 Claims, 3 Drawing Sheets

NUCLEAR MAGNETIC RESONANCE TOMOGRAPHY APPARATUS

BACKGROUND OF THE INVENTION

1. Field of the Invention

The present invention is directed to an arrangement for producing tomograms of an examination subject using nuclear magnetic resonance imaging techniques, the apparatus having a basic magnetic field as well as gradient fields and a high-frequency antenna whose inductance forms a resonant circuit together with at least one resonance capacitor.

2. Description of the Prior Art

Systems for producing tomograms of an examination subject, preferably a human body, using nuclear magnetic resonance imaging techniques are known. Such NMR (or MRI) systems have a basic field magnet that aligns the nuclear spins in the human body, gradient coils that respectively generate spatially different magnetic fields, and high-frequency coils for exciting the nuclear spins and for receiving the signals emitted by the excited nuclei. When using such a high-frequency excitation and measuring coil, the inductivity of the coil is connected together with a capacitor to form an LC resonant circuit, the capacitor arrangement then being tuned in accord with the desired frequency. A variable parallel capacitor as well as a series capacitor arranged in the feeder for coupling the resonator to a high-frequency generator are generally provided. This high-frequency generator preferably is an oscillator having a following transmission amplifier. Variable disc capacitors, whose capacitance can be controlled by electric motors, are generally employed as variable capacitors.

Dependent on the size of the examination subject, for example a patient, the resonator is loaded, i.e. damped, to different degrees. When matching the resonator to the high-frequency generator whose intrinsic impedance can, for example, amount to 50 ohms, one thus obtains matching frequencies that are dependent on the degree to which the resonator is loaded. The characteristic frequency of the resonator must therefore be detuned such that the resonant frequency from the rated (desired) value caused by the different load of the resonator is compensated. To this end, a tuning of the resonator is undertaken after the introduction of a patient into the nuclear magnetic resonance tomography apparatus by successively adjusting the series capacitor for load matching and the parallel capacitor for frequency correction until the required tuning is achieved.

The no-load quality of the resonator generally amounts to approximately 500 through 1000. Under the load of a patient, this quality normally drops to values below 100. The power of the high-frequency generator must also be designed for this case. All lower load instances require lower high-frequency powers, i.e. when the full amplifier power is forwarded to the antenna in no-load operation or given a weak load, for example as a result of a child as patient, unacceptable voltage or current peaks can then arise. These could in theory be suppressed by appropriate design of the software; for safety reasons, however, such antennas are designed for this maximum load, which is higher than necessary by roughly a factor of three.

SUMMARY OF THE INVENTION

It is an object of the invention to simplify and to improve a nuclear magnetic resonance tomography apparatus of the type described above so that an overdimensioning of the resonator is avoided and, at the same time, unacceptable peak amplitudes of the high-frequency field in case of operator's error are not possible.

The invention is based on the perception that impermissible peak amplitudes can be avoided when, after an upward transgression of a limiting voltage value at the resonator, a further rise is avoided within a very short time by using electronic circuitry, this short time not significantly exceeding 100 ns.

The above object is achieved in a magnetic resonance imaging apparatus of the type having a transmission coil connected to a capacitor to form a resonant circuit, which includes circuitry for limiting the voltage across the resonator in the transmission mode. In an especially simple embodiment of the arrangement of the invention, electronic limiting elements, for example Zener diodes or varistors or over-voltage arresters, can be connected parallel to the resonance capacitor, these limiting elements taking effect when a predetermined limit value of the voltage in the resonant circuit is exceeded and preventing a further rise in voltage after a slight, harmless voltage elevation.

Means for detuning the resonant circuit can be provided in a further embodiment. In this embodiment, a means for voltage measurement is allocated to the resonance capacitor, this means for voltage measurement supplying a voltage to a voltage comparator that is proportional to the voltage at the resonance capacitor. The voltage comparator through-connects a PIN diode as soon as the measured voltage exceeds a predetermined limit value. The resonant circuit is detuned with the assistance of the PIN diode and an impermissible voltage rise in thus prevented. The reflection factor of the antenna can also be enhanced with the assistance of the PIN diode and the power feed can thereby be correspondingly limited. The power supply to the resonator can also be interrupted by the output of the voltage comparator as soon as a limit voltage value (which is preferably variable) is exceeded.

DESCRIPTION OF THE PREFERRED EMBODIMENTS

Figure 1:
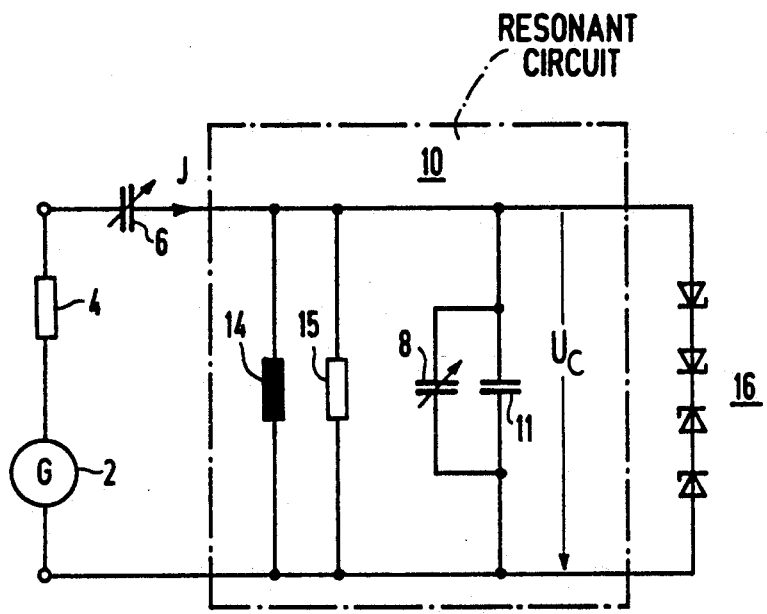
FIG. 1 is a circuit diagram of a first embodiment of a voltage limiting circuit for a magnetic resonance imaging apparatus constructed in accordance with the principles of the present invention.

The equivalent circuit diagram of FIG. 1 of an antenna for an arrangement for producing tomograms using nuclear magnetic resonance imaging techniques includes a high-frequency generator 2 having an internal resistance reference 4, a series capacitor 6 having a variable capacitance, and a resonant circuit 10. The resonant circuit 10 contains a resonance capacitor 11 to which a parallel capacitor 8 having variable capacitance is allocated, and also contains an antenna inductance 14 with losses that are illustrated as a resistor 15. Limiting elements 16 that are connected parallel to the resonance capacitor 11 are provided for limiting the voltage $U_c$ at the resonance capacitor 11. These limiting elements 16, for example, can be Zener diodes disposed in two series circuits connected with opposite polarity. For a maximum operating voltage of the resonant circuit 10 of, for example, $U_B=4$ kV, an opposite connection of $2\times25$ Zener diodes with a Zener voltage of 200 V (or what are referred to as suppressor diodes) is required. Zener diodes having low internal or intrinsic capacitance are preferably provided for voltage limitation. Their internal capacitance should be negligibly small in comparison to the capacitance of the resonance capacitor 11. For simplification, only two Zener diodes are shown in the respective oppositely connected series circuits of Zener diodes in FIG. 1.

Deviating from the illustrated embodiment of FIG. 1, voltage-dependent resistors, referred to as varistors, or over-voltage arresters (preferably gas-filled arrestors) can be provided for voltage limitation at the resonance capacitor 11.

Figure 2:
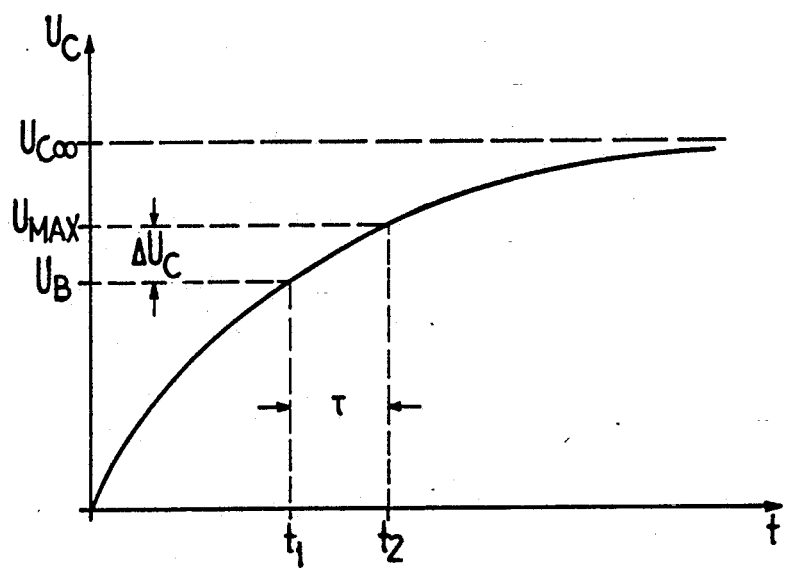
FIG. 2 is a voltage/time diagram for explaining the operation of the circuit of FIG. 1.

According to the diagram of FIG. 2, wherein the voltage $U_c$ at the resonance capacitor 11 is entered over the time t, the envelope of the voltage $U_c$ at the resonance capacitor 11 approaches a value $U_{c\infty}$ after the activation of a high-frequency pulse. At time $t_1$, for example, this envelope should have reached the maximally anticipated operating voltage $U_B$ of, for example, $U_B=4$ kV. When this maximum operating voltage is reached, the voltage limiting elements 16 take effect and, following a switch delay $\tau$, the maximally allowable voltage value which, for example, is allowed to amount to $U_{max}=5$ kV, is reached at time $t_2$. If, in accord with FIG. 1, series circuits of Zener diodes are provided for voltage limitation (whose switching times, as is known, are extremely short and are on the order of magnitude of approximately 1 ns), the switch delay $\tau$ then is extremely short (a few nsec) and consequently the possible voltage elevation $\Delta U_c$ will be extremely slight.

Figure 3:
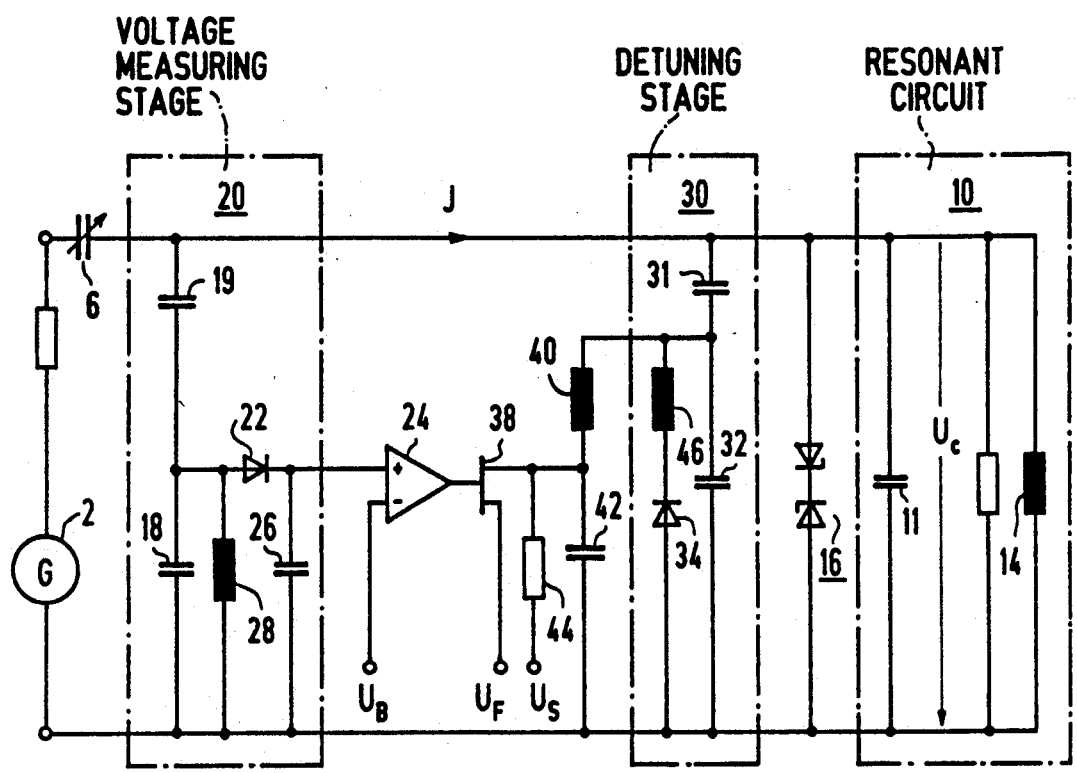
FIG. 3 is a circuit diagram of a further embodiment of the invention wherein voltage limitation is achieved by detuning the resonator.

In the embodiment of an arrangement for the operation of the antenna of a nuclear magnetic resonance tomograph according to FIG. 3, the voltage limitation is produced by detuning the resonant circuit 10. To this end, a stage 20 for voltage measurement at the resonance capacitor 11 is provided, this stage 20 containing a capacitive voltage divider having precision capacitors 18 and 19 with a tap connected via a rectifier diode 22 to the positive input of a voltage comparator 24, which compares this voltage value to a limit voltage value that is supplied to its negative input. The voltage measurement stage 20 also contains a smoothing capacitor 26 and a high-frequency inductor 28. The output signal of the voltage comparator 24 initiates detuning of the resonant circuit 10. A stage 30 for detuning, which contains a voltage divider composed of a detuning capacitor 31 and a further detuning capacitor 32, is provided for this purpose. The precision capacitors 18 and 19 as well as the detuning capacitors 31 and 32 contribute to the compensation of the antenna inductivity 14, and thus form a part of the overall resonance capacitance. The output of the comparator 24 is connected via an electronic switch 38 and a high-frequency inductor 40 to the tap of the voltage divider. Together with a capacitor 42, the high-frequency inductor 40 forms a low-pass filter for blocking high-frequency components. The electronic switch 38, which may be a field effect transistor, is connected across a PIN diode 34. One electrode of the switch 38 is supplied with a positive inhibit voltage $U_S$ for the PIN diode 34 via a drop resistor 44, and a second electrode is supplied with a negative voltage $U_F$ for the PIN diode 34. As soon as it is through-connected (i.e., biased to a conducting state) by the voltage comparator 24 via the switch 38, the PIN diode 34 shorts the detuning capacitor 32 which, in series with the detuning capacitor 31, is connected parallel to the resonance capacitor 11. The switch delay $\tau$ can be up to about 100 ns in this embodiment, having a limitation of the voltage $U_c$ at the resonance capacitor 11 by detuning the resonant circuit 10.

In a further development of the arrangement shown in FIG. 3, limiting elements 16 can be additionally provided parallel to the resonance capacitor 11, these limiting elements 16 limiting the voltage $U_c$ very rapidly. For example, series circuits of Zener diodes can be provided as limiting elements, only one of which is shown in the FIG. 3 for simplification. In this embodiment, the voltage $U_c$ is limited after a few ns and the limiting elements 16 then accept the current I until the stage 30 has achieved the voltage limitation by detuning the resonant circuit 10.

In another embodiment, the PIN diode 34 of FIG. 3 can also have an inductance 46 allocated to it, which is substantially ineffective in normal operation of the antenna in the inhibited condition of the PIN diode 34. The inductance 46 can preferably be dimensioned such that, in case of a voltage elevation in the resonant circuit 10, it forms a resonant circuit with the detuning capacitor 32 after the through-connection of the PIN diode 34, which thereby effects a correspondingly greater detuning.

Figure 4:
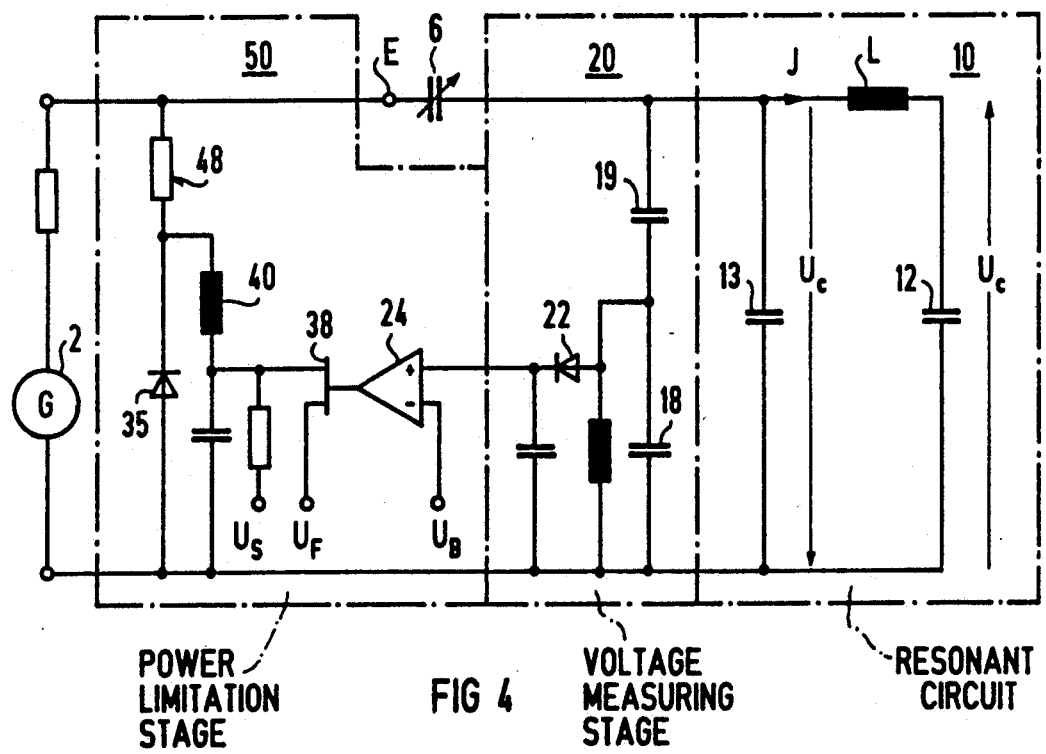
FIGS. 4 and 5 are respective circuit diagrams of further embodiments of the invention wherein voltage limitation is achieved by limiting the power supply.

In the embodiment of a voltage limitation in the resonant circuit 10 formed by a division of the resonance capacitance with resonance capacitors 12 and 13 of FIG. 4, the voltage limitation is produced by a stage 50 for power limitation. The stage 20 for voltage limitation, which contains a series circuit of the precision capacitor 18 and the further precision capacitor 19, is also allocated to the resonant circuit 10. If the capacitance of the resonance capacitor 12 is, for example, 100 pF, the size of the resonance capacitor 13 as well as the precision capacitors 18 and 19 is selected such that they yield approximately 100 pF together. In this embodiment, for example, a precision capacitor 18 of 40 pF and a precision capacitor 19 of 10 pF can then be provided. As in the embodiment of FIG. 3, the voltage at the voltage divider of the measuring stage 20 is supplied via the diode 22 to the voltage comparator 24, whose output signal is supplied via the switch 38 and via the high-frequency inductor 40 to the stage 50 for power limitation. This output signal causes through-connection of a PIN diode 35 which, in series with a parallel impedance 48, is connected parallel to the input E of the antenna in this embodiment. By activating the parallel impedance 48, a part of the high-frequency power is reflected at the input E of the antenna. The power supply from the high-frequency generator 2 is limited to such an extent with this discontinuous increase in the reflection factor r such that a further rise of the voltage $U_c$ is no longer possible in the resonant circuit 10. The parallel impedance 48 that is introduced at the input of the antenna by the PIN diode 35 can be composed of an ohmic resistor of, for example, approximately 20 ohms. A capacitive resistor or an inductive resistor is also suitable.

Figure 5:
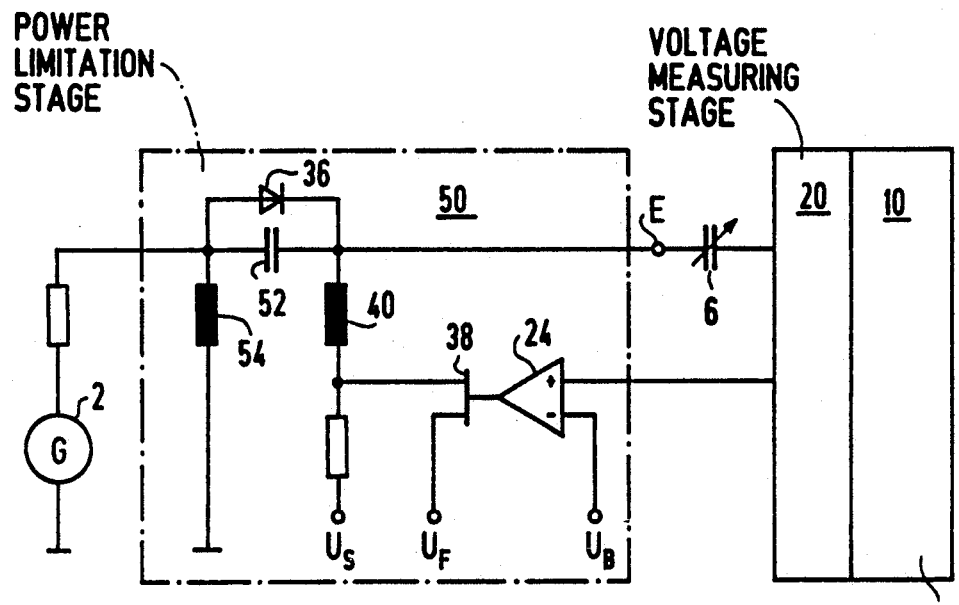

In the embodiment of FIG. 5, a voltage limitation in the resonant circuit 10 is obtained by a stage 50 for limiting the power supply to the antenna. To this end, the input E is preceded by a limiting capacitor 52 to which a PIN diode 36 is connected in parallel. Dependent on the voltage $U_c$ in the resonant circuit 10, this is through-connected by the voltage comparator 24 via the switch 38 and via the HF inductor 40 as soon as the voltage $U_c$ reaches the limit value $U_B$ that has been set. The capacitor 52, which forms part of the matching capacitor 6, is shorted by the PIN diode 36 and the power supply is thus limited by increasing the reflection factor. An HF inductor 54 can also be provided for protection the generator 2 against DC voltages $U_S$ and $U_F$.

Figure 6:
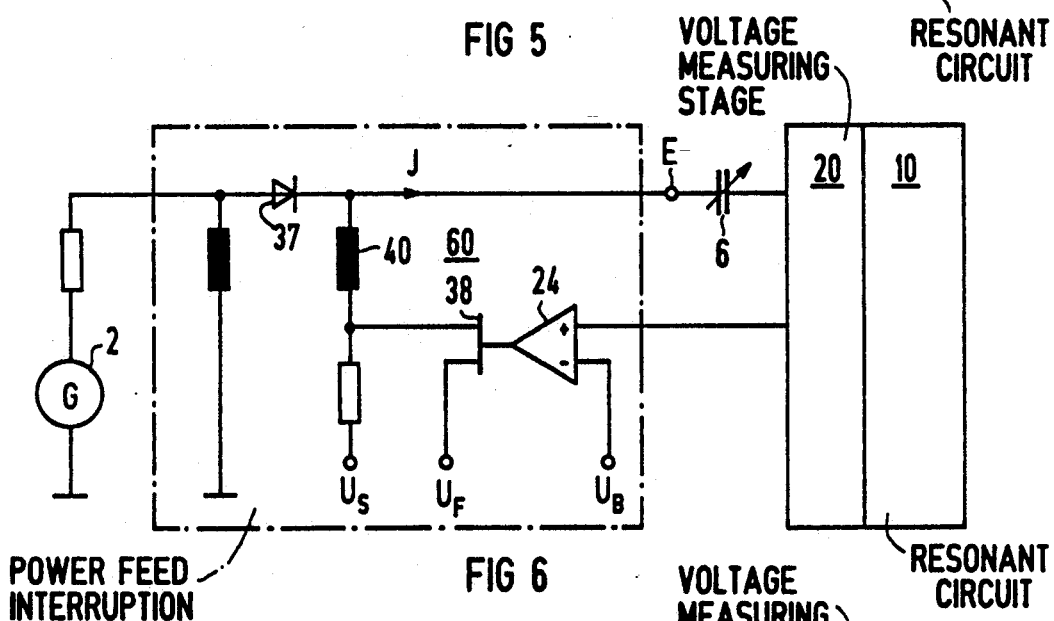
FIGS. 6 and 7 are respective circuit diagrams of further embodiments of the invention wherein voltage limitation is achieved by interrupting the power feed to the resonant circuit.

In the embodiment according to FIG. 6, a stage 60 for interrupting the power feed is provided for voltage limitation, this stage 60 containing a PIN diode 37 that precedes the input E of the antenna. During undisturbed operation, this PIN diode 37 is through-connected and carries the current I. In this embodiment, a negative voltage $U_F$ is supplied to the switch 38. As soon as the voltage $U_c$ in the resonant circuit 10 reaches the limit value $U_B$, the PIN diode 37 is inhibited by the voltage comparator 24 on the basis of an appropriate output signal via the switch 38 and via the HF inductor 40, and thus the power feed is interrupted.

Figure 7:
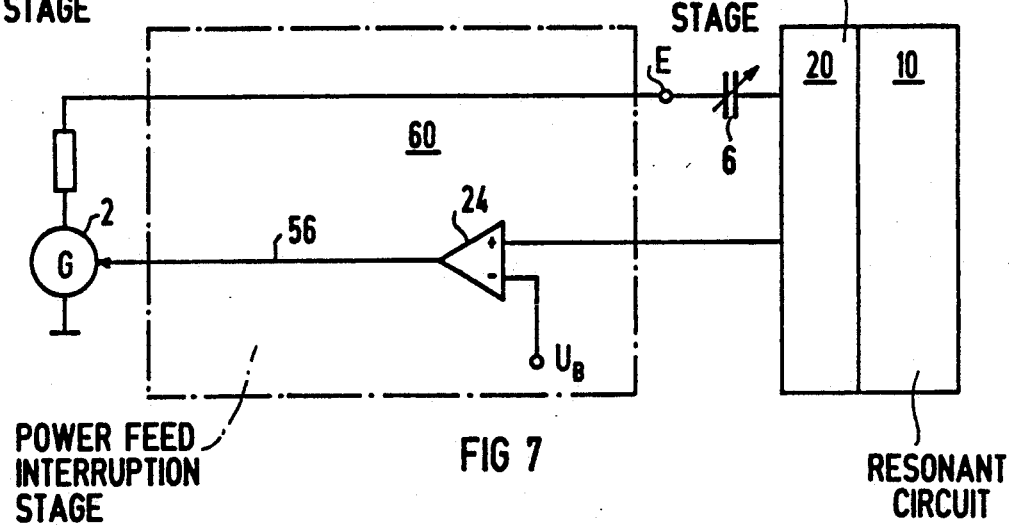

In the embodiment of FIG. 7, however, the output signal of the voltage comparator 24 can also be directly transmitted to the generator 2, for example via a control line 56 composed of an optical fiber cable, and can render the generator 2 ineffective. To this end, the output signal can, for example, block the output amplifier of the generator 2.

Although modifications and changes may be suggested by those skilled in the art, it is the intention of the inventor to embody within the patent warranted hereon all changes and modifications as reasonably and properly come within the scope of hi contribution to the art.

I claim as my invention:

1. In a nuclear magnetic resonance apparatus for producing a tomogram of an examination subject, said apparatus having a high-frequency antenna for generating signals to excite nuclear spins in an examination subject and for receiving signals corresponding to the excited nuclear spins, said high-frequency antenna having an inductance which forms a resonant circuit in combination with at least one resonance capacitor, the improvement comprising:
    means for limiting the voltage across said resonance capacitor in a transmission mode of said high-frequency antenna.

2. The improvement of claim 1, wherein said means for limiting comprise a plurality of Zener diodes connected with opposite polarity across said resonance capacitor.

3. The improvement of claim 1, wherein said means for limiting comprises a plurality of varistors connected across said resonance capacitor.

4. The improvement of claim 1, wherein said means for limiting comprises a plurality of over-voltage arrestors connected across said resonance capacitor.

5. The improvement of claim 1, wherein said means for limiting comprises means for detuning said resonant circuit.

6. The improvement of claim 5, wherein said means for detuning comprises:
    a PIN diode connected to said resonant circuit; and
    means for biasing said PIN diode to a conducting state and thereby detuning said resonant circuit.

7. The improvement of claim 6, further comprising:
    means for measuring the voltage across said resonance capacitor, said voltage divider having a tap;
    a voltage comparator having a positive input connected to said tap of said voltage divider and a negative input supplied with a limit voltage value; and
    a detuning capacitor connected across said PIN diode, said output of said voltage comparator being connected to said means for biasing said PIN diode so that said PIN diode is biased to said conducting state when said limit voltage value is exceeded thereby shorting said detuning capacitor.

8. The improvement of claim 7 further comprising:
    a high-frequency inductor connected in series with said PIN diode and forming a further resonant circuit in combination with said detuning capacitor.

9. The improvement of claim 5, wherein said means for detuning is connected in parallel with said resonance capacitor.

10. The improvement of claim 1, wherein said means for limiting is a means for limiting power delivery to said resonant circuit.

11. The improvement of claim 10, wherein said means for limiting power delivery comprises:
    a series branch formed by an impedance and a PIN diode, said series branch being connected across an input of said high-frequency antenna;
    means for measuring the voltage across said resonance capacitor;
    means for comparing the voltage across said resonance capacitor as measured by said means for measuring with a limit voltage value; and
    means, connected to an output of said means for comparing, for biasing said PIN diode to a conducting state when said voltage across said resonance capacitor reaches said limit voltage value.

12. The improvement of claim 10, wherein said means for limiting the power delivery includes a limiting capacitor connected in series with a further capacitor at an input of said high-frequency antenna:
    a PIN diode connected across said limiting capacitor; and
    means for biasing said PIN diode to a conducting state, thereby shorting said limiting capacitor, when the voltage across said resonance capacitor exceeds a predetermined value.

13. The improvement of claim 1, wherein said means for limiting is a means for interrupting power delivery to said resonant circuit.

14. The improvement of claim 13, wherein said means for interrupting the power delivery comprises:
    a PIN diode connected to an input of said high-frequency antenna; and
    means for biasing said PIN diode to a blocking state when the voltage across said resonance capacitor reaches a predetermined voltage.

15. The improvement of claim 13, wherein said means for interrupting the power delivery comprises:

means for measuring the voltage across said resonance capacitor;
means for comparing the voltage across said resonance capacitor as measured by said means for measuring with a limit voltage value; and
means, connected to an output of said means for comparing, for blocking power supply to an input of said high-frequency antenna if the voltage across said resonance capacitor reaches said limit voltage value.

* * * * *